(12) United States Patent
Huang et al.

(10) Patent No.: US 12,279,099 B2
(45) Date of Patent: Apr. 15, 2025

(54) CHANNEL CONFIGURATION METHOD OF DRIVING MOTOR BY USING AUDIO AND DEVICE

(71) Applicant: HUAWEI TECHNOLOGIES CO., LTD., Guangdong (CN)

(72) Inventors: Ting Huang, Shenzhen (CN); Chen Zhu, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 240 days.

(21) Appl. No.: 18/042,942

(22) PCT Filed: Aug. 12, 2021

(86) PCT No.: PCT/CN2021/112366
§ 371 (c)(1),
(2) Date: Feb. 24, 2023

(87) PCT Pub. No.: WO2022/042327
PCT Pub. Date: Mar. 3, 2022

(65) Prior Publication Data
US 2023/0319477 A1    Oct. 5, 2023

(30) Foreign Application Priority Data
Aug. 31, 2020    (CN) .......................... 202010902838.5

(51) Int. Cl.
*H04R 5/04*    (2006.01)
*G06F 3/16*    (2006.01)
(Continued)

(52) U.S. Cl.
CPC ............. *H04R 5/04* (2013.01); *G06F 3/162* (2013.01); *H04M 1/6058* (2013.01);
(Continued)

(58) Field of Classification Search
CPC ...... H04R 5/04; H04R 5/033; H04R 2420/03; H04R 2420/05; G06F 3/162;
(Continued)

(56) References Cited

U.S. PATENT DOCUMENTS 8,910,191 B2 *  12/2014  Pereira .................... G06F 3/162
                                                                719/321
11,972,055 B2 *  4/2024  Chou .................... G06F 1/1616
(Continued)

*Primary Examiner* — Xu Mei
(74) *Attorney, Agent, or Firm* — Fish & Richardson P.C.

(57) ABSTRACT

An audio service module is communicatively connected to an audio abstraction module. The audio abstraction module is communicatively connected to a codec driver. The codec driver is communicatively connected to a codec chip. The audio service module receives a headset insertion/removal message and sends the message to the audio abstraction module. The audio abstraction module determines a digital-to-analog converter DAC channel configuration policy in the codec chip based on the headset insertion/removal message, and sends the DAC channel configuration policy to the codec driver. A DAC channel is used to transmit earpiece or headset data, and transmit motor data to a class-D amplifier to drive the motor. The codec driver controls the codec chip to reconfigure the DAC channel based on the DAC channel configuration policy.

20 Claims, 8 Drawing Sheets

(51) Int. Cl.
*H03M 1/66* (2006.01)
*H04M 1/60* (2006.01)
*H04R 5/033* (2006.01)
*H04S 1/00* (2006.01)

(52) U.S. Cl.
CPC ............ *H04R 5/033* (2013.01); *H04S 1/007* (2013.01); *H03M 1/66* (2013.01); *H04R 2420/03* (2013.01); *H04R 2420/05* (2013.01)

(58) Field of Classification Search
CPC ... H04M 1/6058; H04M 1/6016; H04S 1/007; H03M 1/66; G10L 19/008
USPC .................... 381/309, 74, 384; 455/575.2
See application file for complete search history.

(56) References Cited

U.S. PATENT DOCUMENTS

| | | | | |
|---|---|---|---|---|
| 2013/0073295 A1* | 3/2013 | Johnson | .............. | H04M 1/6025 704/500 |
| 2017/0177294 A1* | 6/2017 | Mullah | .................... | G06F 3/165 |
| 2024/0214757 A1* | 6/2024 | Wang | ..................... | H04R 1/403 |

\* cited by examiner

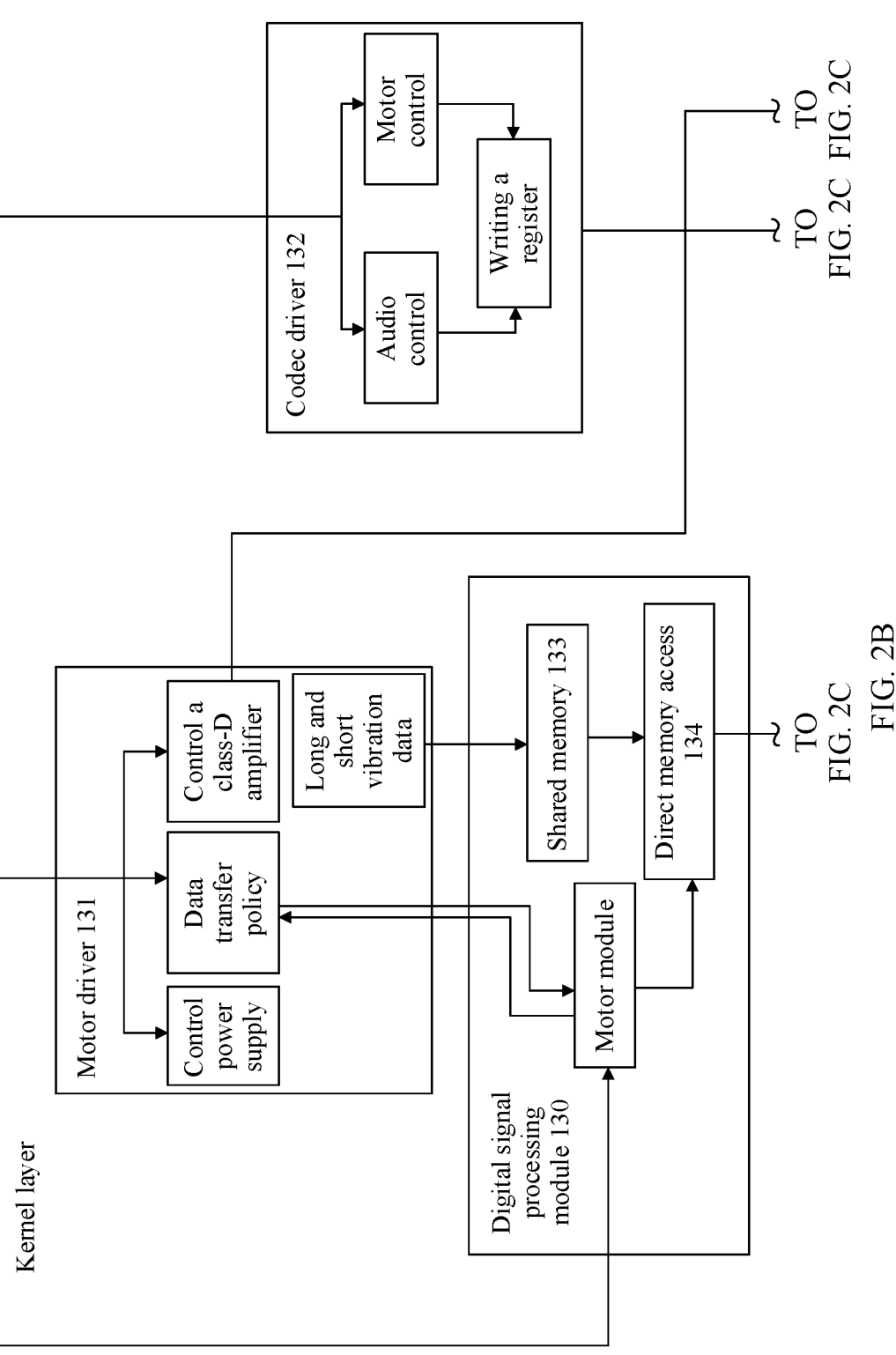

S301: An electronic device receives a motor vibration instruction from a first application program by using a motor service module, converts the motor vibration instruction into a motor vibration message, and sends the motor vibration message to a motor abstraction module and an audio service module S302: The electronic device parses the motor vibration message by using the motor abstraction module, determines a motor vibration type corresponding to the motor vibration message, and sends the motor vibration type to the motor driver S303: The electronic device receives the motor vibration type by using the motor driver, determines target motor data based on the motor vibration type, and transmits the target motor data to a DSP by using a shared memory S304: The electronic device receives a headset insertion/removal message by using the audio service module, and sends the headset insertion/removal message to an audio abstraction module S305: The electronic device receives the headset insertion/removal message by using the audio abstraction module, determines a digital-to-analog converter DAC channel configuration policy in a codec chip based on the headset insertion/unplugging message, and sends the DAC channel configuration policy to a codec driver, where a DAC channel is used to transmit earpiece or headset data, and transmit motor data to a class-D amplifier ClassD to drive a motor S306: The electronic device receives the DAC channel configuration policy by using the codec driver, and controls, by using the codec driver, the codec chip to reconfigure the DAC channel based on the DAC channel configuration policy S307: The electronic device receives, by using the DSP, a target DAC channel that is for transmitting motor data and that is sent by the audio abstraction module, and controls, by using the DSP, DMA to transmit the target motor data to the target DAC channel in the codec chip S308: The electronic device receives the target motor data through the target DAC channel in the codec chip, and transmits the target motor data to the ClassD through the configured target DAC channel to drive the motor

FIG. 5

CHANNEL CONFIGURATION METHOD OF DRIVING MOTOR BY USING AUDIO AND DEVICE

CROSS REFERENCE TO RELATED APPLICATIONS

This application is a national stage of International Application No. PCT/CN2021/112366, filed on Aug. 12, 2021, which claims priority to Chinese Patent Application No. 202010902838.5, filed on Aug. 31, 2020. Both of the aforementioned applications are incorporated herein by reference in their entireties.

TECHNICAL FIELD

This application relates to the field of communications technologies, and in particular, to a channel configuration method of driving a motor by using audio and a device.

BACKGROUND

Motors are widely applied to electronic devices (for example, smartphones). Currently, an electronic device can drive a motor only by using an independent motor driver, and the motor driver is only configured to drive the motor. Therefore, costs are relatively high. In addition, there are only several fixed motor vibration effects, and the vibration effects cannot be edited.

Currently, the electronic device may further drive the motor by using a codec chip. However, the codec chip has three digital-to-analog converters DACs in total, where a DAC left channel DAC L and a DAC right channel DAC L are used by an earpiece and a headset, and a DAC ultrasonic channel DAC UL is used by an ultrasonic wave, and no additional DAC can be provided for the motor.

SUMMARY

This application provides a channel configuration method of driving a drive motor by using audio and a device, to implement driving a motor by using audio, reduce costs, and improve richness of motor-based special effects.

According to a first aspect, this application provides a channel configuration method of driving a motor by using audio, applied to an electronic device, where the electronic device is provided with an Android system, a system of driving a motor by using audio that is of the electronic device includes an audio service module, an audio abstraction module, a codec driver, and a codec chip, the audio service module is communicatively connected to the audio abstraction module, the audio abstraction module is communicatively connected to the codec driver, the codec driver is communicatively connected to the codec chip, the audio service module is disposed at an application architecture layer of the Android system, the audio abstraction module is disposed at a hardware abstraction layer of the Android system, the codec driver is disposed at a kernel layer of the Android system, the codec chip is disposed at a hardware layer of the Android system, and the method includes:

receiving a headset insertion/removal message by using the audio service module, and sending the headset insertion/removal message to the audio abstraction module;

receiving the headset insertion/removal message by using the audio abstraction module, determining a digital-to-analog converter DAC channel configuration policy in the codec chip based on the headset insertion/removal message, and sending the DAC channel configuration policy to the codec driver, wherein a DAC channel is used to transmit earpiece or headset data, and transmit motor data to a class-D amplifier ClassD to drive the motor; and receiving the DAC channel configuration policy by using the codec driver, and controlling, by using the codec driver, the codec chip to reconfigure the DAC channel based on the DAC channel configuration policy.

In the foregoing method, when detecting an action of inserting or removing a headset by using a system of driving a motor by using audio, an electronic device re-determines a DAC channel configuration policy in a codec chip, and reconfigures a DAC channel based on the DAC channel configuration policy, so that the DAC channel not only may be used to transmit earpiece or headset data, but also may be used to transmit motor data to a class-D amplifier ClassD to drive the motor. This implements a solution of driving a motor by using audio, and reduces driving costs. Moreover, driving a motor by using audio helps improve diversity of vibration effects of the motor.

With reference to the first aspect, in a possible implementation of the first aspect, the determining a digital-to-analog converter DAC channel configuration policy in the codec chip based on the headset insertion/removal message includes: When the headset insertion/removal message is a headset removal message, that the digital-to-analog converter DAC channel configuration policy in the codec chip is a first DAC channel configuration policy is determined; or when the headset insertion/removal message is a headset insertion message, that the digital-to-analog converter DAC channel configuration policy in the codec chip is a second DAC channel configuration policy is determined.

With reference to the first aspect, in a possible implementation of the first aspect, the first DAC channel configuration policy includes: transmitting earpiece data through a DAC left DAC L channel, transmitting motor data through a DAC right DAC R channel, and transmitting ultrasonic data through a DAC ultrasonic DAC UL channel; or transmitting motor data through a DAC L channel, transmitting earpiece data through a DAC R channel, and transmitting ultrasonic data through a DAC UL channel.

With reference to the first aspect, in a possible implementation of the first aspect, the first DAC channel configuration policy includes: transmitting earpiece data through a DAC left channel DAC L and/or a DAC right channel DAC R, and transmitting motor data through a DAC ultrasonic channel DAC UL.

With reference to the first aspect, in a possible implementation of the first aspect, the second DAC channel configuration policy includes: transmitting first headset data through a DAC left channel DAC L, transmitting second headset data through a DAC right channel DAC R, and transmitting motor data through a DAC ultrasonic channel DAC UL.

With reference to the first aspect, in a possible implementation of the first aspect, the DAC UL channel further transmits ultrasonic data, and a priority of the motor data is different from a priority of the ultrasonic data.

With reference to the first aspect, in a possible implementation of the first aspect, when a display of the electronic device is in a screen-on state, a motor vibration channel for transmitting motor data is in a connected state; and when the display of the electronic device is in a screen-off state, the motor vibration channel is in a disconnected state, and the motor vibration channel includes a DAC channel for transmitting motor data.

With reference to the first aspect, in a possible implementation of the first aspect, the system of driving a motor by using audio further includes a first application program, a motor service module, a motor abstraction module, a motor driver, a motor, and a digital signal processing module DSP, the DSP includes a shared memory and direct memory access DMA, the first application program is communicatively connected to the motor service module, the motor service module is communicatively connected to the motor abstraction module and the audio service module, and the motor abstraction module is communicatively connected to the motor driver, the motor driver and the audio abstraction module are communicatively connected to the DSP, the shared memory is communicatively connected to the DMA, the DSP is communicatively connected to the codec chip, the codec chip is communicatively connected to the motor, the first application program is disposed at an application layer of the Android system, the motor service module is disposed at an application architecture layer of the Android system, the motor abstraction module is disposed at a hardware abstraction layer of the Android system, the motor driver and the DSP are disposed at a kernel layer of the Android system, the motor is disposed at a hardware layer of the Android system, and the method further includes:

receiving a motor vibration instruction from the first application program by using the motor service module, converting the motor vibration instruction into a motor vibration message, and sending the motor vibration message to the motor abstraction module and the audio service module;

parsing the motor vibration message by using the motor abstraction module, determining a motor vibration type corresponding to the motor vibration message, and sending the motor vibration type to the motor driver;

receiving the motor vibration type by using the motor driver, determining target motor data based on the motor vibration type, and transmitting the target motor data to the DSP by using the shared memory;

receiving, by using the DSP, a target DAC channel that is for transmitting motor data and that is sent by the audio abstraction module, and controlling, by using the DSP, the DMA to transmit the target motor data to the target DAC channel in the codec chip; and receiving the target motor data through the target DAC channel in the codec chip, and transmitting the target motor data to the ClassD through the configured target DAC channel to drive the motor.

With reference to the first aspect, in a possible implementation of the first aspect, the display of the electronic device is in a screen-off state, and after the sending the motor vibration message to a motor abstraction module and the audio service module, the method further includes: receiving the motor vibration message by using the audio service module, and sending a motor startup message to the audio abstraction module based on the motor vibration message; and receiving and delivering the motor startup message by using the audio abstraction module, to enable a motor vibration channel.

With reference to the first aspect, in a possible implementation of the first aspect, after the receiving the motor vibration message by using the audio service module, and sending a motor startup message to the audio abstraction module based on the motor vibration message, the method further includes: receiving the motor vibration message by using the audio service module within a first preset time period.

With reference to the first aspect, in a possible implementation of the first aspect, after the receiving and delivering the motor startup message by using the audio abstraction module, to enable the motor vibration channel, the method further includes: if the audio service module does not receive the motor vibration message within a second preset time period, sending a motor shutdown message to the audio abstraction module; and receiving and delivering the motor shutdown message by using the audio abstraction module, to disable the motor vibration channel.

With reference to the first aspect, in a possible implementation of the first aspect, using the codec driver to receive the DAC channel configuration policy, and controlling, by using the codec driver, the codec chip to reconfigure the DAC channel based on the DAC channel configuration policy includes: using the codec driver to receive the DAC channel configuration policy, and determining whether there is an audio output service; and when an audio output service is detected, invoking the codec driver to disable an audio channel, and controlling the codec chip to reconfigure the DAC channel based on the DAC channel configuration policy.

With reference to the first aspect, in a possible implementation of the first aspect, when the headset insertion/removal message is the headset insertion message, and after reconfiguring the DAC channel based on the DAC channel configuration policy, the method further includes: using the codec driver to enable an earpiece channel for transmitting earpiece data; and using the motor driver to enable a ClassD channel for transmitting motor data after a third preset time period.

According to a second aspect, this application provides a channel configuration apparatus of driving a motor by using audio, applied to an electronic device, where the electronic device is provided with an Android system, a system of driving a motor by using audio that is of the electronic device includes an audio service module, an audio abstraction module, a codec driver, and a codec chip, the audio service module is communicatively connected to the audio abstraction module, the audio abstraction module is communicatively connected to the codec driver, the codec driver is communicatively connected to the codec chip, the audio service module is disposed at an application architecture layer of the Android system, the audio abstraction module is disposed at a hardware abstraction layer of the Android system, the codec driver is disposed at a kernel layer of the Android system, the codec chip is disposed at a hardware layer of the Android system, and the channel configuration apparatus of driving a motor by using audio includes:

a processing module, configured to: invoke the audio service module to receive a headset insertion/removal message by using a transceiver module, and send the headset insertion/removal message to the audio abstraction module by using the transceiver module;

invoke the audio abstraction module to receive the headset insertion/removal message by using the transceiver module, determine a digital-to-analog converter DAC channel configuration policy in the codec chip based on the headset insertion/removal message, and send the DAC channel configuration policy to the codec driver by using the transceiver module, where a DAC channel is used to transmit earpiece or headset data, and transmit motor data to a class-D amplifier ClassD to drive the motor; and invoke the codec driver to receive the DAC channel configuration policy by using the transceiver module, and control, by using the codec driver, the codec chip to reconfigure the DAC channel based on the DAC channel configuration policy.

In the foregoing apparatus, when detecting an action of inserting or removing a headset by using a system of driving a motor by using audio, an electronic device re-determines a DAC channel configuration policy in a codec chip, and reconfigures a DAC channel based on the DAC channel configuration policy, so that the DAC channel not only may be used to transmit earpiece or headset data, but also may be used to transmit motor data to a class-D amplifier ClassD to drive the motor. This implements a solution of driving a motor by using audio, and reduces driving costs. Moreover, driving a motor by using audio helps improve diversity of vibration effects of the motor.

With reference to the second aspect, in a possible implementation of the second aspect, in terms of the determining a digital-to-analog converter DAC channel configuration policy in the codec chip based on the headset insertion/removal message, the processing module is specifically configured to: when the headset insertion/removal message is a headset removal message, determine that the digital-to-analog converter DAC channel configuration policy in the codec chip is a first DAC channel configuration policy; or when the headset insertion/removal message is a headset insertion message, determine that the digital-to-analog converter DAC channel configuration policy in the codec chip is a second DAC channel configuration policy.

With reference to the second aspect, in a possible implementation of the second aspect, the first DAC channel configuration policy includes: transmitting earpiece data through a DAC left DAC L channel, transmitting motor data through a DAC right DAC R channel, and transmitting ultrasonic data through a DAC ultrasonic DAC UL channel; or transmitting motor data through a DAC L channel, transmitting earpiece data through a DAC R channel, and transmitting ultrasonic data through a DAC UL channel.

With reference to the second aspect, in a possible implementation of the second aspect, the first DAC channel configuration policy includes: transmitting earpiece data through a DAC left channel DAC L and/or a DAC right channel DAC R, and transmitting motor data through a DAC ultrasonic channel DAC UL.

With reference to the second aspect, in a possible implementation of the second aspect, the second DAC channel configuration policy includes: transmitting first headset data through a DAC left channel DAC L, transmitting second headset data through a DAC right channel DAC R, and transmitting motor data through a DAC ultrasonic channel DAC UL.

With reference to the second aspect, in a possible implementation of the second aspect, the DAC UL channel further transmits ultrasonic data, and a priority of the motor data is different from a priority of the ultrasonic data.

With reference to the second aspect, in a possible implementation of the second aspect, when a display of the electronic device is in a screen-on state, a motor vibration channel for transmitting motor data is in a connected state; and when the display of the electronic device is in a screen-off state, the motor vibration channel is in a disconnected state, and the motor vibration channel includes a DAC channel for transmitting motor data.

With reference to the second aspect, in a possible implementation of the second aspect, the system of driving a motor by using audio further includes a first application program, a motor service module, a motor abstraction module, a motor driver, a motor, and a digital signal processing module DSP, the DSP includes a shared memory and direct memory access DMA, the first application program is communicatively connected to the motor service module, the motor service module is communicatively connected to the motor abstraction module and the audio service module, and the motor abstraction module is communicatively connected to the motor driver, the motor driver and the audio abstraction module are communicatively connected to the DSP, the shared memory is communicatively connected to the DMA, the DSP is communicatively connected to the codec chip, the codec chip is communicatively connected to the motor, the first application program is disposed at an application layer of the Android system, the motor service module is disposed at an application architecture layer of the Android system, the motor abstraction module is disposed at a hardware abstraction layer of the Android system, the motor driver and the DSP are disposed at a kernel layer of the Android system, the motor is disposed at a hardware layer of the Android system, and the processing module is further configured to:

invoke the motor service module to receive a motor vibration instruction from the first application program by using the transceiver module, convert the motor vibration instruction into a motor vibration message, and send the motor vibration message to the motor abstraction module and the audio service module by using the transceiver module;

invoke the motor abstraction module to parse the motor vibration message, determine a motor vibration type corresponding to the motor vibration message, and send the motor vibration type to the motor driver by using the transceiver module;

invoke the motor driver to receive the motor vibration type by using the transceiver module, determine target motor data based on the motor vibration type, and transmit, by using the transceiver module, the target motor data to the DSP by using the shared memory;

invoke the DSP to receive, by using the transceiver module, a target DAC channel that is for transmitting motor data and that is sent by the audio abstraction module, and control, by using the DSP, the DMA to transmit the target motor data to the target DAC channel in the codec chip by using the transceiver module; and invoke the target DAC channel in the codec chip to receive the target motor data by using the transceiver module, and transmit the target motor data to the ClassD by using the transceiver module through the configured target DAC channel, to drive the motor.

With reference to the second aspect, in a possible implementation of the second aspect, the display of the electronic device is in a screen-off state, and after sending the motor vibration message to the motor abstraction module and the audio service module by using the transceiver module, the processing module is further configured to: invoke the audio service module to receive the motor vibration message by using the transceiver module, and send a motor startup message to the audio abstraction module by using the transceiver module based on the motor vibration message; and invoke the audio abstraction module to receive and deliver the motor startup message by using the transceiver module, to enable a motor vibration channel.

With reference to the second aspect, in a possible implementation of the second aspect, after invoking the audio service module to receive the motor vibration message by using the transceiver module, and send, by using the transceiver module, a motor startup message to the audio abstraction module based on the motor vibration message, the processing module is further configured to invoke the audio service module to receive the motor vibration message by using the transceiver module within a first preset time period.

With reference to the second aspect, in a possible implementation of the second aspect, after invoking the audio abstraction module to receive and deliver the motor startup message by using the transceiver module, to enable the motor vibration channel, the processing module is further configured to: if the audio service module does not receive the motor vibration message within a second preset time period, invoke the audio service module to send a motor shutdown message to the audio abstraction module by using the transceiver module; and invoke the audio abstraction module to receive and deliver the motor shutdown message by using the transceiver module, to disable the motor vibration channel.

With reference to the second aspect, in a possible implementation of the second aspect, in terms of invoking the codec driver to receive the DAC channel configuration policy by using the transceiver module, and controlling, by using the codec driver, the codec chip to reconfigure the DAC channel based on the DAC channel configuration policy, the processing module is configured to: invoke the codec driver to receive the DAC channel configuration policy by using the transceiver module, and determine whether there is an audio output service; and when an audio output service is detected, invoke the codec driver to disable an audio channel, and control the codec chip to reconfigure the DAC channel based on the DAC channel configuration policy.

With reference to the second aspect, in a possible implementation of the second aspect, when the headset insertion/removal message is the headset insertion message, and after reconfiguring the DAC channel based on the DAC channel configuration policy, the processing module is further configured to: invoke the codec driver to enable an earpiece channel for transmitting earpiece data; and invoke the motor driver to enable a ClassD channel for transmitting motor data after a third preset time period.

According to a third aspect, this application provides an electronic device, where the electronic device includes a processor and a memory, the memory is configured to store program code, and the processor is configured to invoke the program code in the memory to perform the method according to any possible implementation of the first aspect.

According to a fourth aspect, this application provides an electronic device, where the electronic device includes a processor, the processor is coupled to a memory, and the processor is configured to invoke program code in the memory to perform the method according to any possible implementation of the first aspect.

According to a fifth aspect, this application provides a readable storage medium, where the readable storage medium stores instructions, and when the instructions are run on an electronic device, the electronic device performs the method according to any possible implementation of the first aspect.

According to a sixth aspect, an embodiment of this application provides a computer program product. When the computer program product runs on a terminal device, the electronic device performs the method according to any possible implementation of the first aspect.

BRIEF DESCRIPTION OF DRAWINGS

FIG. 2A to FIG. 2C are a schematic diagram of a signal stream of a system of driving a motor by using audio according to an embodiment of this application;

FIG. 5 is a schematic diagram of another channel configuration method of driving a motor by using audio according to an embodiment of this application;

DESCRIPTION OF EMBODIMENTS

The following describes technical solutions in embodiments of this application with reference to accompanying drawings in embodiments of this application.

For ease of understanding of embodiments of this application, concepts in this application are first explained.

A class-D amplifier (ClassD) is an amplifier that drives a speaker by controlling on and off of a switch unit.

A linear motor is generally referred to as a linear motor. A linear motor is a transmission device that directly converts electric energy into linear motion mechanical energy without any intermediate conversion mechanism. The linear motor can be seen as a rotating motor cut radially and spread out into a plane.

A digital-to-analog converter (digital-to-analog converter, DAC) is a component that converts discrete digital signals into analog signals of continuous variables.

A codec (codec) is a device or program that can convert a signal or a data stream. The converting herein includes an operation of encoding (usually for transmission, storage, or encryption) a signal or a data stream or extracting an encoded stream.

Embodiments of this application provide a channel configuration method of driving a motor by using audio and a device. The following first describes in detail a system of driving a motor by using audio adapted to embodiments of this application.

Figure 1:
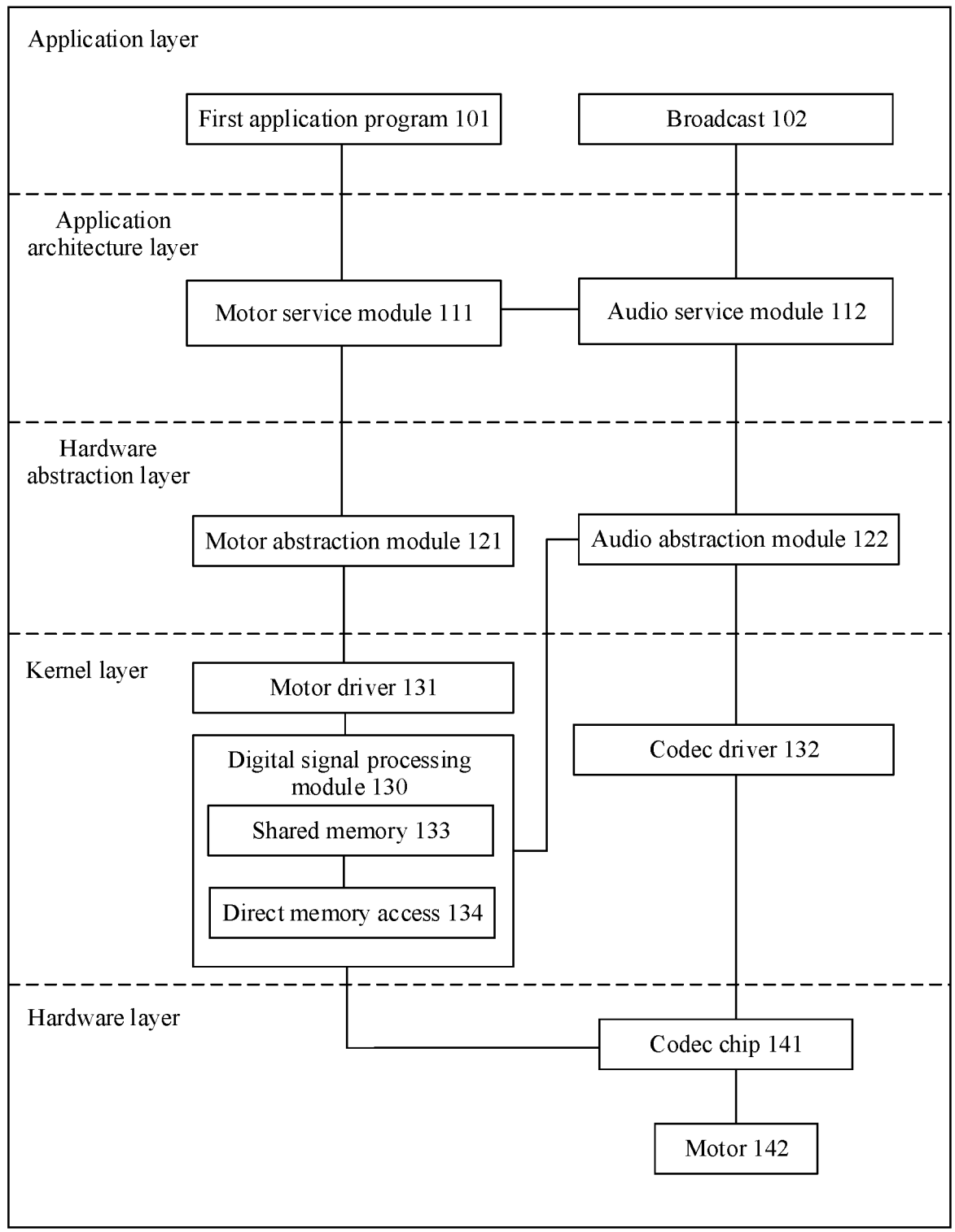
FIG. 1 is a schematic diagram of a system of driving a motor by using audio according to an embodiment of this application.

FIG. 1 shows a system of driving a motor by using audio according to an embodiment of this application. The system includes a first application program 101, a motor service module 111, an audio service module 112, a motor abstraction module 121, an audio abstraction module 122, a digital signal processing module (digital signal processing, DSP) 130 (the DSP 130 includes a shared memory 133 and direct memory access (direct memory access, DMA) 134), a motor driver 131, a codec driver 132, a codec chip 141, and a motor 142, the first application program 101 is communicatively connected to the motor service module 111, the motor service module 111 is communicatively connected to the motor abstraction module 121 and the audio service module 112, the motor abstraction module 121 is communicatively connected to the motor driver 131, the audio service module 112 is communicatively connected to the audio abstraction module 122, the audio abstraction module 122 is communicatively connected to the codec driver 132 and the DSP 130, the codec driver 132 is communicatively connected to the codec chip 141, and the motor driver 131 is communicatively connected to the DSP 130, the shared memory 133 is communicatively connected to the DMA 134, the DSP 130 is communicatively connected to the codec chip 141, the codec chip 141 is communicatively connected to the motor 142, the first application program 101 is disposed at an application layer of an Android system, the motor service module 111 and the audio service module 112 are disposed at an application architecture layer of the Android system, the motor abstraction module 121 and the audio abstraction module 122 are disposed at a hardware abstraction layer of the Android system, the DSP 130, the motor driver 131, and the codec driver 132 are disposed at a kernel layer of the Android system, and the codec chip 141 and the motor 142 are disposed at a hardware layer of the Android system.

Figure 2A:
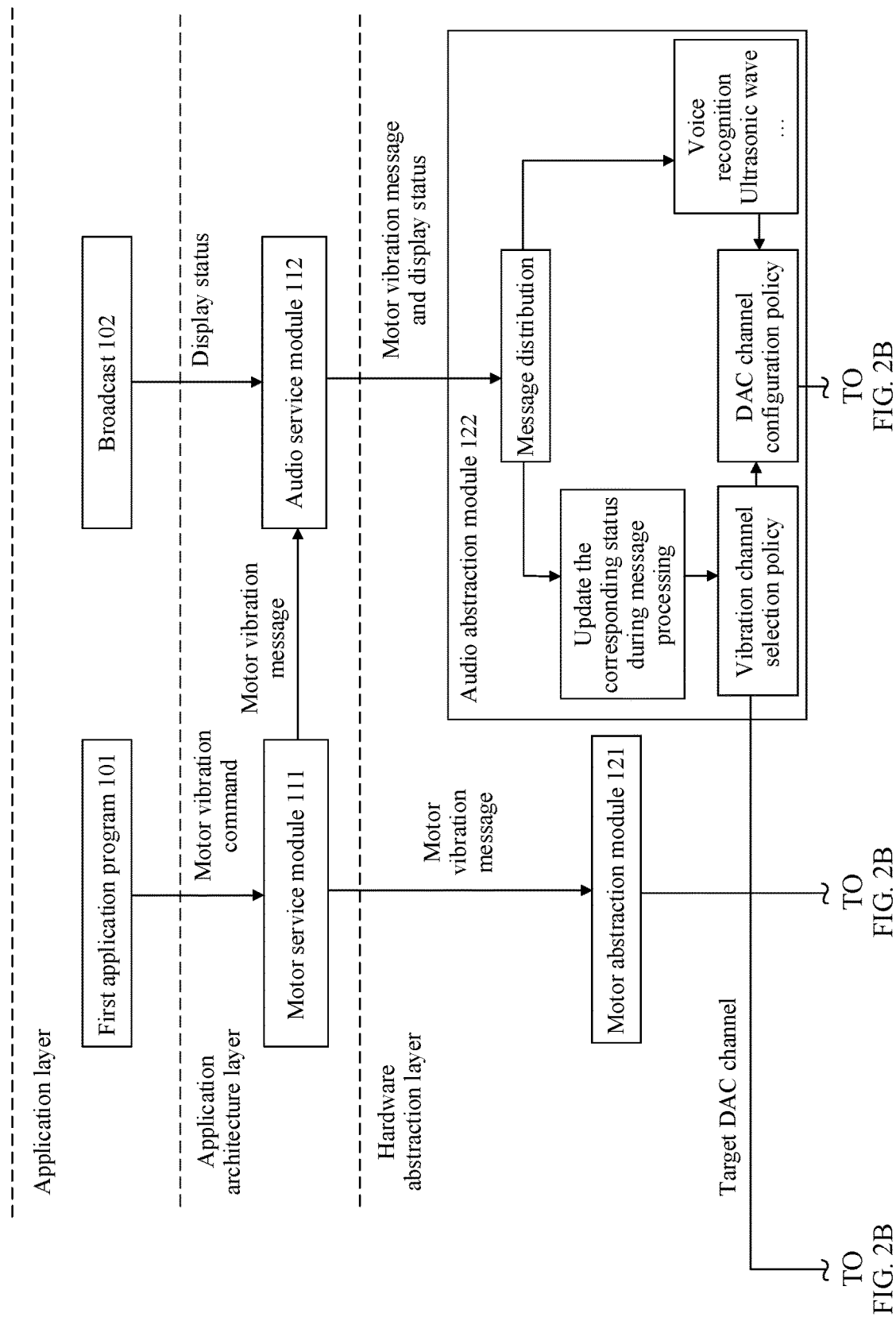
Figure 2C:
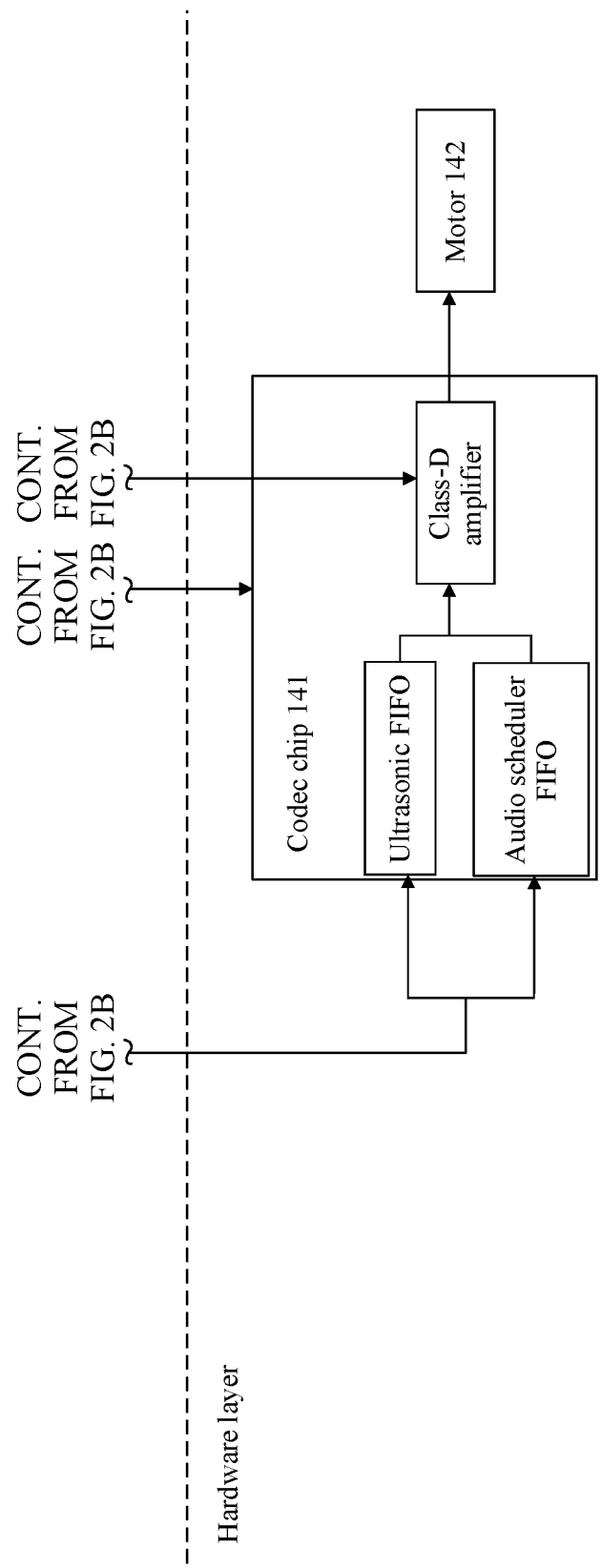

Specifically, a signal stream of each module in the system of driving a motor by using audio is shown in FIG. 2A to FIG. 2C. The first application program 101 is configured to send a motor vibration instruction to the motor service module 111. The motor service module 111 is configured to: receive the motor vibration instruction from the first application program 101, convert the motor vibration instruction into a motor vibration message, and send the motor vibration message to the motor abstraction module 121 and the audio service module 112. The motor abstraction module 121 is configured to: parse the motor vibration message, determine a motor vibration type corresponding to the motor vibration message, and send the motor vibration type to the motor driver 131. The motor driver 131 is configured to: receive the motor vibration type, determine target motor data based on the motor vibration type, and transmit the target motor data to the DSP 130 and/or the DMA 134 by using the shared memory 133. The motor driver 131 is further configured to: control a class-D amplifier ClassD module on the codec chip 141 to be turned on, control a power supply, and control a motor data transmit policy. The transmit policy may include a DSP channel selection policy, a transmit start time, a transmit end time, and the like. The DSP module further includes an additionally developed motor module, configured to control, according to the motor data migration policy, the DMA to transmit the target motor data. The audio service module 112 is configured to receive a broadcast message indicating that a headset is inserted or removed, and send the headset insertion/removal message and the motor vibration message to the audio abstraction module 122. The audio abstraction module 122 is configured to: receive the headset insertion/removal message and distribute the message, and determine a digital-to-analog converter DAC channel configuration policy in the codec chip 141 based on the headset insertion/removal message. The audio abstraction module 122 is further configured to: receive the motor vibration message and a display status, determine, based on the display status, whether to deliver a motor startup message or a motor shutdown message, and deliver a motor startup message based on the motor vibration message when the motor startup message needs to be delivered, to enable a motor vibration channel. The audio abstraction module 122 further sends a target DAC channel of the target motor data to the motor module in the DSP, and sends the DAC channel configuration policy to the codec driver 132. The DAC channel is used to transmit earpiece or headset data, and transmit motor data to the class-D amplifier ClassD to drive the motor. The codec driver 132 receives the DAC channel configuration policy, and controls, by using a motor control and an audio control, the codec chip 141 to configure DAC channel according to the DAC channel configuration policy. The DMA 134 is configured to transfer the target motor data to the target DAC channel of the codec chip 141. The codec chip 141 is configured to receive the target motor data, and transmit the target motor data to the ClassD through the configured target DAC channel to drive the motor 142.

Specifically, the electronic device needs to calibrate the ClassD in the system of driving a motor by using audio, and may use an acceleration calibrating method, for example, performing calibrating by using a method of playing a sound source of different frequencies to see a maximum Z-direction acceleration value to determine a resonance frequency of the motor.

In addition, motor vibration experience is required during startup of the electronic device. Therefore, a motor operation needs to be supported in a fastboot fastboot phase, that is, an X-axis motor can be started to vibrate in the fastboot phase. The motor driver needs to support configuration of a motor micro electronic component IC module in the fastboot phase. Startup vibration is implemented by writing a register. In the fastboot phase, a motor waveform needs to be directly written to the register (first input first output, FIFO) because the DMA is not started. In addition, the register of the codec chip needs to be written to configure motor vibration.

It should be noted that the terms "system" and "network" may be used interchangeably in embodiments of this application, and "a plurality of" means two or more. In view of this, in embodiments of this application, "a plurality of" may also alternatively be understood as "at least two". The term "and/or" describes an association relationship between associated objects and indicates that three relationships may exist. For example, A and/or B may indicate the following cases: Only A exists, both A and B exist, and only B exists, where A and B may be singular or plural. In addition, the character "/" usually indicates an "or" relationship between the associated objects unless otherwise specified.

Figure 3:
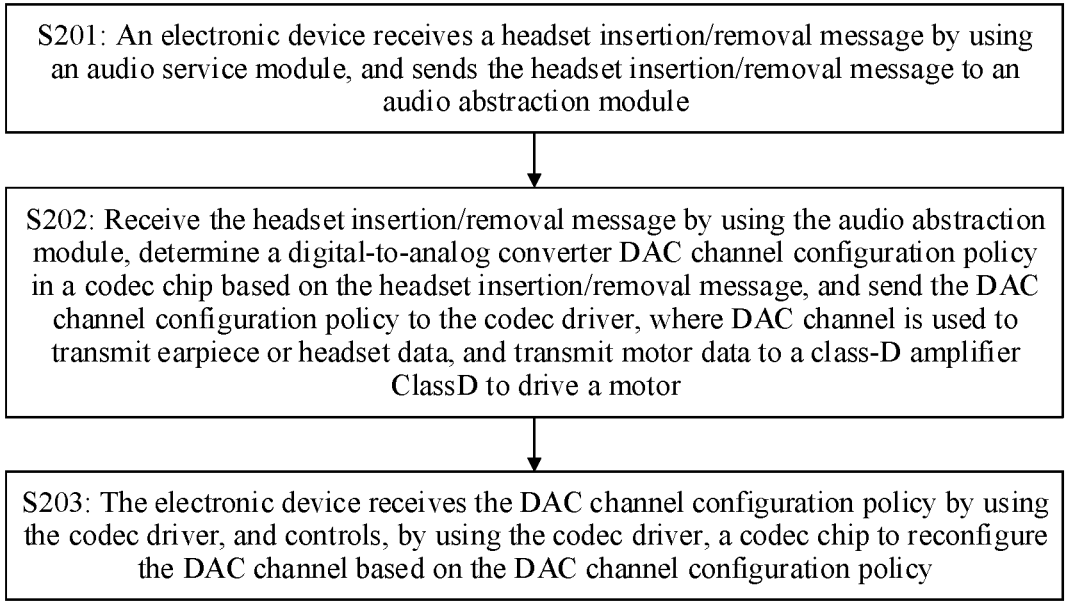
FIG. 3 is a schematic diagram of a channel configuration method of driving a motor by using audio according to an embodiment of this application.

FIG. 3 shows a schematic diagram of a channel configuration method of driving a motor by using audio according to an embodiment of this application. The system shown in FIG. 1 is used as an example. As shown in FIG. 3, the channel configuration method of driving a motor by using audio executed in the system includes the following steps.

S201: An electronic device receives a headset insertion/removal message by using the audio service module, and sends the headset insertion/removal message to the audio abstraction module.

The headset insertion/removal message includes a headset insertion message and a headset removal message, and the headset insertion/removal message is a message received by the audio service module through broadcasting.

S202: The electronic device receives the headset insertion/removal message by using the audio abstraction module, determines a digital-to-analog converter DAC channel configuration policy in the codec chip based on the headset insertion/removal message, and sends the DAC channel configuration policy to the codec driver, where a DAC channel is used to transmit earpiece or headset data, and transmit motor data to a class-D amplifier ClassD to drive the motor.

The DAC channel includes at least three channels. For example, when the DAC channel includes three channels, which may be a DAC left DAC L channel, a DAC right DAC R channel, and a DAC ultrasonic DAC UL channel. Specifically, the DAC L channel may be used to transmit earpiece data or headset left channel data, the DAC right DAC R channel may be used to transmit earpiece data or headset right channel data, the DAC ultrasonic DAC UL channel may be used to transmit ultrasonic data, and the ultrasonic data may be used for mistouch prevention detection.

In a possible implementation, determining the digital-to-analog converter DAC channel configuration policy in the codec chip based on the headset insertion/removal message includes:
when the headset insertion/removal message is a headset removal message, determining that the digital-to-analog converter DAC channel configuration policy in the codec chip is a first DAC channel configuration policy; or
when the headset insertion/removal message is a headset insertion message, determining that the digital-to-analog converter DAC channel configuration policy in the codec chip is a second DAC channel configuration policy.

The first DAC channel configuration policy is different from the second DAC channel configuration policy. The first DAC channel configuration policy and the second DAC channel configuration policy may be various, and each of the first DAC channel configuration policy and the second DAC channel configuration policy includes a DAC channel configuration policy for transmitting motor data. This is not limited herein.

In this implementation, the electronic device determines different DAC channel configuration policies based on different headset insertion/removal messages, which is conducive to reasonableness and diversity of slot DAC channel configuration, thereby implementing driving a motor by using audio.

In this possible implementation, the first DAC channel configuration policy includes: transmitting earpiece data through a DAC left DAC L channel, transmitting motor data through a DAC right DAC R channel, and transmitting ultrasonic data through a DAC ultrasonic DAC UL channel; or transmitting motor data through a DAC L channel, transmitting earpiece data through a DAC R channel, and transmitting ultrasonic data through a DAC UL channel.

Figure 4:
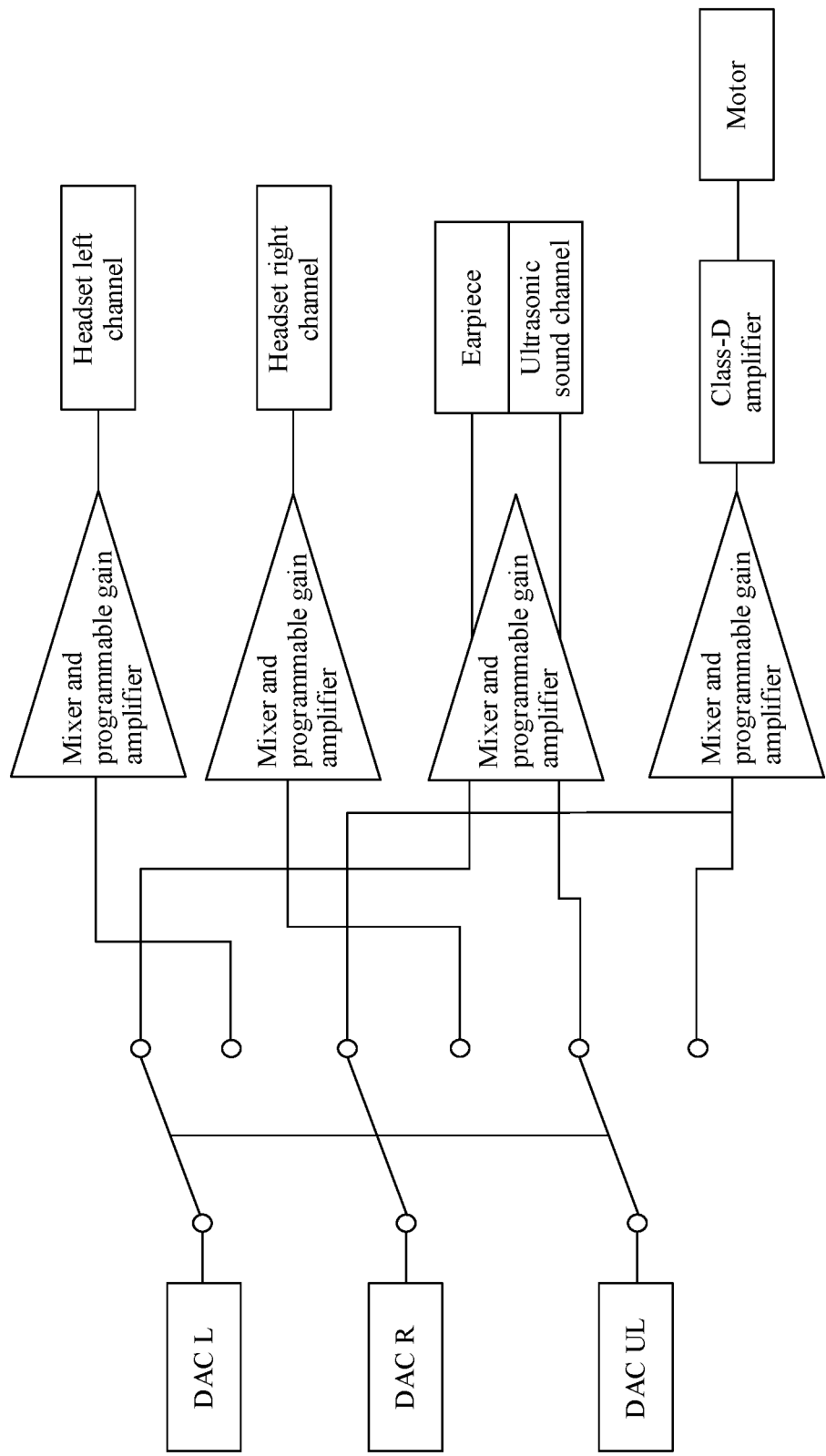
FIG. 4 is a schematic diagram of a hardware circuit of an audio digital-to-analog converter DAC channel according to an embodiment of this application.

Specifically, a channel configuration of transmitting earpiece data through the DAC left DAC L channel, transmitting motor data through the DAC right DAC R channel, and transmitting ultrasonic data through the DAC ultrasound DAC UL channel is shown in FIG. 4. Alternatively, motor data may be transmitted through the DAC left DAC L channel, and earpiece data may be transmitted through the DAC right DAC R channel. Details are not described herein.

It can be learned that, in this implementation, in an earpiece mode, because an earpiece itself is a mono sound source, only one DAC channel is required. Therefore, the motor data is transmitted through another channel to implement an effect of driving a motor by using audio, which helps reduce motor driving costs and improve hardware utilization.

In a possible implementation, the first DAC channel configuration policy includes: transmitting earpiece data through a DAC left channel DAC L and/or a DAC right channel DAC R, and transmitting motor data through a DAC ultrasonic channel DAC UL.

In a possible implementation, the second DAC channel configuration policy includes: transmitting first headset data through a DAC left channel DAC L, transmitting second headset data through a DAC right channel DAC R, and transmitting motor data through a DAC ultrasonic channel DAC UL.

Because the DAC ultrasonic channel DAC UL transmits motor data, there is no additional channel for transmitting ultrasonic data. In this implementation, an ultrasonic mistouch prevention function may be implemented by using another solution, for example, a mistouch prevention function of an electronic device is implemented by using a solution such as optical detection or image detection. This is not limited herein.

It can be learned that, in the foregoing two implementations, an ultrasonic channel function that may be replaced by another solution is changed to a function of transmitting motor data to drive a motor, and the ultrasonic channel function is implemented by using the another solution. This reduces motor driving costs, avoids a decrease in a function of an electronic device, and improves flexibility of driving a motor by using audio.

In a possible implementation, the DAC UL channel further transmits ultrasonic data, and a priority of the motor data is different from a priority of the ultrasonic data.

The DAC UL channel is multiplexed, not only used to transmit ultrasonic data, but also used to transmit motor data. When the DAC UL channel is multiplexed, priorities of the motor data and the ultrasonic data may be set. For example, a priority of the motor data is set to be higher than a priority of the ultrasonic data, or a priority of the ultrasonic data is set to be higher than a priority of the motor data. This is not limited herein.

It can be learned that, in this implementation, setting different priorities to implement multiplexing of the DAC UL channel by the ultrasonic data and the motor data helps improve utilization of the DAC when driving a motor by using audio is implemented.

S203: The electronic device receives the DAC channel configuration policy by using the codec driver, and controls, by using the codec driver, the codec chip to reconfigure the DAC channel based on the DAC channel configuration policy.

After receiving the DAC channel configuration policy by using the codec driver, the electronic device first disables all audio channels, and then controls the codec chip to reconfigure the DAC channel according to the DAC channel configuration policy, so that popping noise in a configuration process can be effectively avoided.

When the audio channel are disabled and the DAC channel is reconfigured according to the DAC channel configuration policy, whether there is a motor vibration message may be preferentially detected. If there is no vibration message, configuration may be performed according to a general configuration policy. If there is a motor vibration message, the motor needs to vibrate within 30 ms. Otherwise, vibration loss may occur when continuous vibration such as typing by using an input method occurs. To prevent vibration loss, channel configuration needs to be optimized, that is, a motor channel configuration time needs to be optimized. During a channel configuration process, initialization configuration of the speaker that is irrelevant to the channel may be placed after the motor channel configuration. In this way, a motor channel is established in advance, and a motor vibration time may be optimized.

In a possible implementation, the receiving the DAC channel configuration policy by using the codec driver, and controlling, by using the codec driver, the codec chip to reconfigure the DAC channel based on the DAC channel configuration policy includes:
receiving, by using the codec driver, the DAC channel configuration policy, and determining whether there is an audio output service; and
when an audio output service is detected, disabling an audio channel by using the codec driver, and controlling the codec chip to reconfigure the DAC channel based on the DAC channel configuration policy.

Specifically, when the DAC channel configuration policy is determined after the headset insertion/removal message is obtained, if there is no audio output service, the DAC channel may not be immediately reconfigured, but the DAC channel is reconfigured only when an audio output service is detected. For example, when the headset insertion/removal message is a headset insertion message, there is no audio output service at this time, and the DAC channel is not immediately reconfigured, that is, if there is audio, the audio is still output through an earpiece, the channel is reconfigured when an audio output service is detected, and the audio is output from a headset.

It can be learned that, in this implementation, after the headset insertion/removal message is obtained and the DAC channel configuration policy is determined, the DAC channel is not configured immediately, but the DAC channel is reconfigured only when audio output is detected, which helps reduce resource occupation and improve necessity of channel configuration.

In the foregoing method, when detecting an action of inserting or removing a headset by using a system of driving a motor by using audio, an electronic device re-determines a DAC channel configuration policy in a codec chip, and reconfigures DAC channel based on the DAC channel configuration policy, so that the DAC channel not only may be used to transmit earpiece or headset data, but also may be used to transmit motor data to a class-D amplifier ClassD to drive the motor. This implements a solution of driving a motor by using audio, and reduces driving costs. Moreover, driving a motor by using audio helps improve diversity of vibration effects of the motor.

In a possible implementation, when a display of the electronic device is in a screen-on state, a motor vibration channel for transmitting motor data is in a connected state; and when the display of the electronic device is in a screen-off state, the motor vibration channel is in a disconnected state, and the motor vibration channel includes a DAC channel for transmitting motor data.

In the screen-on state, the motor channel is always enabled. When there is a motor vibration requirement or there is no motor vibration requirement, only a ClassD module with relatively high power consumption is controlled to be enabled and disabled. In normal use, no vibration loss occurs, and power consumption is reduced. In addition, in the screen-off state, the channel is disabled, and the channel is enabled when there is a motor vibration requirement. Meanwhile, there are fewer motor vibration events in a process of switching from the screen-off state to the screen-on state, so that this method can effectively reduce loss of motor vibration.

In the screen-on state, because the motor channel is in a normally open state, the audio abstraction module does not deliver the motor startup message or the motor shutdown message based on the state of the display.

It can be learned that, in this implementation, in the screen-on state, the motor vibration channel is always turned on, and in the screen-off state, the motor vibration channel is turned off, and is turned on as required. This helps reduce loss of motor vibration and reduce power consumption of the electronic device.

In a possible implementation, the method further includes:

receiving a motor vibration instruction from the first application program by using the motor service module, converting the motor vibration instruction into a motor vibration message, and sending the motor vibration message to the motor abstraction module and the audio service module;

parsing the motor vibration message by using the motor abstraction module, determining a motor vibration type corresponding to the motor vibration message, and sending the motor vibration type to the motor driver;

receiving the motor vibration type by using the motor driver, determining target motor data based on the motor vibration type, and transmitting the target motor data to the DSP by using the shared memory;

receiving, by using the DSP, a target DAC channel that is for transmitting motor data and that is sent by the audio abstraction module, and controlling, by using the DSP, the DMA to transmit the target motor data to the target DAC channel in the codec chip; and receiving the target motor data through the target DAC channel in the codec chip, and transmitting the target motor data to the ClassD through the configured target DAC channel to drive the motor.

After receiving the motor vibration message sent by the motor service module, the motor abstraction module parses the motor vibration message, and determines a vibration type of motor vibration by using an extensible markup language (extensible markup language, XML) starting from a system EMUI 11.

The motor vibration type may include a special effect type, a sound follow-up type, a Google long vibration type, and the like. This is not limited herein. A motor vibration message is directly delivered for the special effect type, a motor vibration message is cyclically delivered for the sound follow-up type, and a motor vibration message is continuously delivered for a total time for the Google long vibration type.

The motor service module sends the motor vibration message to the audio service module, so that the audio service module instructs the audio abstraction module to enable the motor vibration channel.

The motor driver stores a motor vibration waveform. When the motor vibrates, the motor driver transmits special effect data to the DMA in a memory sharing manner, and transmits the special effect data to the DSP. In addition, data needs to be transferred during vibration, and the ClassD module needs to be turned on.

Specifically, a sampling rate of 1 k is used for a special effect waveform of the motor. One special effect lasts 20 ms, and takes about 40 bytes. There are at least six special effects, taking about 240 bytes of data.

The target DAC channel may be a DAC L channel, a DAC R channel, or a DAC UL channel.

Specifically, in a process of performing this implementation, the audio service module may synchronously receive a headset insertion/removal message, that is, this implementation may be performed in parallel with S201, S202, and S203.

It can be learned that, in this implementation, the electronic device uses the system of driving a motor by using audio to implement driving a motor by using audio through data transmission between levels, and can improve richness of special effects of motor vibration.

In a possible implementation, when the display of the electronic device is in the screen-off state, and after the sending the motor vibration message to the motor abstraction module and the audio service module, the method further includes:

receiving the motor vibration message by using the audio service module, and sending a motor startup message to the audio abstraction module based on the motor vibration message; and receiving and delivering the motor startup message by using the audio abstraction module, to enable the motor vibration channel.

It can be learned that, in this implementation, when the display of the electronic device is in the screen-off state, the audio service module is communicatively connected to the motor service module, and the audio service module may receive the motor vibration message sent by the motor service module, so that a motor vibration channel of the audio driver motor can be enabled as required, thereby reducing power consumption of the electronic device and improving motor driving convenience.

In a possible implementation, after the receiving the motor vibration message by using the audio service module, and sending a motor startup message to the audio abstraction module based on the motor vibration message, the method further includes:

receiving the motor vibration message by using the audio service module within a first preset time period.

The first preset time period may be, for example, three s or four s. This is not limited herein.

Specifically, after the motor vibration message is received by using the audio service module and the motor startup message is sent to the audio abstraction module based on the motor vibration message, the motor startup message is not delivered if the motor vibration message is received again by using the audio service module within the first preset time period.

Message distribution of the motor startup message and the motor shutdown message may be implemented by using a setParameter interface of the audio abstraction module. Specifically, when messages are delivered, keywords of the motor startup message and the motor shutdown message are respectively vibrator_state=on or vibrator_state=off.

Specifically, the audio driver receives an audio route audio route configuration command transmitted by the audio abstraction module, establishes a motor vibration channel based on a route map route map, and agrees with the motor driver that a motor data sampling rate is 96 k, and a 48 k*2 module of a left channel SRC2 needs to be disabled.

It can be learned that, in this implementation, when the motor vibration message is received for a plurality of times within the first preset time period, the motor startup message is delivered only once. This avoids a negative impact caused by frequent switching of the motor channel due to a plurality of times of sending the motor startup message, and reduces power consumption of the electronic device.

In a possible implementation, after the receiving and delivering the motor startup message by using the audio abstraction module, to enable the motor vibration channel, the method further includes:

if the audio service module does not receive the motor vibration message within a second preset time period, sending a motor shutdown message to the audio abstraction module; and receiving and delivering the motor shutdown message by using the audio abstraction module, to disable the motor vibration channel.

The second preset time period may be the same as the first preset time period, or may be different from the first preset time period. This is not limited herein.

Specifically, if no motor startup message is received again within the second preset time period, a motor shutdown message is delivered, to disable the motor channel.

It can be learned that, in this implementation, if no motor vibration message is received within the second preset time period, the motor shutdown message is delivered, to disable the motor channel, thereby helping reduce power consumption of the electronic device.

In a possible implementation, the headset insertion/removal message is the headset insertion message, and after the reconfiguring the DAC channel based on the DAC channel configuration policy, the method further includes:

enabling, by using the codec driver, an earpiece channel for transmitting earpiece data; and enabling a ClassD channel for transmitting motor data by using the motor driver after a third preset time period.

The third preset time period may be, for example, 20 ms or 25 ms. This is not limited herein.

It can be learned that, in this implementation, after the headset is inserted, the earpiece channel is first enabled, and then the ClassD channel is enabled after the third preset time period. This helps avoid that popping noise occurs in the headset because an audio data stream is not completely released.

FIG. 5 shows a schematic diagram of another channel configuration method of driving a motor by using audio according to an embodiment of this application. The system shown in FIG. 1 is used as an example. As shown in FIG. 5, the channel configuration method of driving a motor by using audio executed in the system includes the following steps.

S301: An electronic device receives a motor vibration instruction from the first application program by using the motor service module, converts the motor vibration instruction into a motor vibration message, and sends the motor vibration message to the motor abstraction module and the audio service module.

S302: The electronic device parses the motor vibration message by using the motor abstraction module, determines a motor vibration type corresponding to the motor vibration message, and sends the motor vibration type to the motor driver.

S303: The electronic device receives the motor vibration type by using the motor driver, determines target motor data based on the motor vibration type, and transmits the target motor data to a DSP by using a shared memory.

S304: The electronic device receives a headset insertion/removal message by using the audio service module, and sends the headset insertion/removal message to the audio abstraction module.

S305: The electronic device receives the headset insertion/removal message by using the audio abstraction module, determines a digital-to-analog converter DAC channel configuration policy in a codec chip based on the headset insertion/unplugging message, and sends the DAC channel configuration policy to a codec driver, where DAC channel is used to transmit earpiece or earphone data, and transmit motor data to a class-D amplifier ClassD to drive the motor.

S306: The electronic device receives the DAC channel configuration policy by using the codec driver, and controls, by using the codec driver, the codec chip to reconfigure the DAC channel based on the DAC channel configuration policy.

S307: The electronic device receives, by using the DSP, a target DAC channel that is for transmitting motor data and that is sent by the audio abstraction module, and controls, by using the DSP, DMA to transmit the target motor data to the target DAC channel in the codec chip.

S308: The electronic device receives the target motor data through the target DAC channel in the codec chip, and transmits the target motor data to the ClassD through the configured target DAC channel to drive the motor.

In the foregoing method, when detecting an action of inserting or removing a headset by using a system of driving a motor by using audio, an electronic device re-determines a DAC channel configuration policy in a codec chip, and reconfigures DAC channel based on the DAC channel configuration policy, so that the DAC channel not only may be used to transmit earpiece or headset data, but also may be used to transmit motor data to a class-D amplifier ClassD to drive the motor. This implements a solution of driving a motor by using audio, and reduces driving costs. Moreover, driving a motor by using audio helps improve diversity of vibration effects of the motor.

Figure 6:
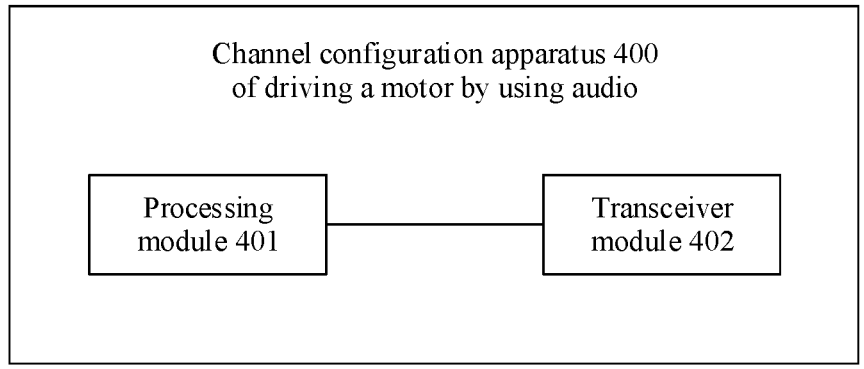
FIG. 6 is a schematic diagram of a channel configuration apparatus of driving a motor by using audio according to an embodiment of this application.

FIG. 6 shows a schematic diagram of a channel configuration apparatus of driving a motor by using audio, applied to an electronic device, where the electronic device is provided with an Android system, a system of driving a motor by using audio that is of the electronic device includes an audio service module, an audio abstraction module, a codec driver, and a codec chip, the audio service module is communicatively connected to the audio abstraction module, the audio abstraction module is communicatively connected to the codec driver, the codec driver is communicatively connected to the codec chip, the audio service module is disposed at an application architecture layer of the Android system, the audio abstraction module is disposed at a hardware abstraction layer of the Android system, the codec driver is disposed at a kernel layer of the Android system, the codec chip is disposed at a hardware layer of the Android system, and the channel configuration apparatus 400 of driving a motor by using audio includes: a processing module 401 and a transceiver module 402.

The processing module 401 is configured to: invoke the audio service module to receive a headset insertion/removal message by using the transceiver module 402, and send the headset insertion/removal message to the audio abstraction module by using the transceiver module 402;

invoke the audio abstraction module to receive the headset insertion/removal message by using the transceiver module 402, determine a digital-to-analog converter DAC channel configuration policy in the codec chip based on the headset insertion/removal message, and send the DAC channel configuration policy to the codec driver by using the transceiver module 402, where DAC channel is used to transmit earpiece or headset data, and transmit motor data to a class-D amplifier ClassD to drive the motor; and invoke the codec driver to receive the DAC channel configuration policy by using the transceiver module 402, and control, by using the codec driver, the codec chip to reconfigure the DAC channel based on the DAC channel configuration policy.

In this embodiment of this application, a first device determines a second device to be coordinated from a plurality of candidate devices based on sent coordination request information and received coordination response information, and sends coordination acknowledgment information to the second device. In an interaction process, the first device or the second device may determine time domain configuration information of a physical downlink control channel PDCCH search space set between the two devices. When the time domain configuration information of the physical downlink control channel PDCCH search space set meets a condition, coordinated transmission is performed, to shorten a coordinated transmission delay.

In a possible implementation, in terms of the determining a digital-to-analog converter DAC channel configuration policy in the codec chip based on the headset insertion/removal message, the processing module 401 is specifically configured to: when the headset insertion/removal message is a headset removal message, determine that the digital-to-analog converter DAC channel configuration policy in the codec chip is a first DAC channel configuration policy; or when the headset insertion/removal message is a headset insertion message, determine that the digital-to-analog converter DAC channel configuration policy in the codec chip is a second DAC channel configuration policy.

In a possible implementation, the first DAC channel configuration policy includes: transmitting earpiece data through a DAC left DAC L channel, transmitting motor data through a DAC right DAC R channel, and transmitting ultrasonic data through a DAC ultrasonic DAC UL channel; or transmitting motor data through a DAC L channel, transmitting earpiece data through a DAC R channel, and transmitting ultrasonic data through a DAC UL channel.

In a possible implementation, the first DAC channel configuration policy includes: transmitting earpiece data through a DAC left channel DAC L and/or a DAC right channel DAC R, and transmitting motor data through a DAC ultrasonic channel DAC UL.

In a possible implementation, the second DAC channel configuration policy includes: transmitting first headset data through a DAC left channel DAC L, transmitting second headset data through a DAC right channel DAC R, and transmitting motor data through a DAC ultrasonic channel DAC UL.

In a possible implementation, the DAC UL channel further transmits ultrasonic data, and a priority of the motor data is different from a priority of the ultrasonic data.

In a possible implementation, when a display of the electronic device is in a screen-on state, a motor vibration channel for transmitting motor data is in a connected state; and when the display of the electronic device is in a screen-off state, the motor vibration channel is in a disconnected state, and the motor vibration channel includes a DAC channel for transmitting motor data.

In a possible implementation, the system of driving a motor by using audio further includes a first application program, a motor service module, a motor abstraction module, a motor driver, a motor, and a digital signal processing module DSP, the DSP comprises a shared memory and direct memory access DMA, the first application program is communicatively connected to the motor service module, the motor service module is communicatively connected to the motor abstraction module and the audio service module, and the motor abstraction module is communicatively connected to the motor driver, the motor driver and the audio abstraction module are communicatively connected to the DSP, the shared memory is communicatively connected to the DMA, the DSP is communicatively connected to the codec chip, the codec chip is communicatively connected to the motor, the first application program is disposed at an application layer of the Android system, the motor service module is disposed at an application architecture layer of the Android system, the motor abstraction module is disposed at a hardware abstraction layer of the Android system, the motor driver and the DSP are disposed at a kernel layer of the Android system, the motor is disposed at a hardware layer of the Android system, and the processing module 401 is further configured to:

invoke the motor service module to receive a motor vibration instruction from the first application program by using the transceiver module 402, convert the motor vibration instruction into a motor vibration message, and send the motor vibration message to the motor abstraction module and the audio service module by using the transceiver module 402;

invoke the motor abstraction module to parse the motor vibration message, determine a motor vibration type corresponding to the motor vibration message, and send the motor vibration type to the motor driver by using the transceiver module 402;

invoke the motor driver to receive the motor vibration type by using the transceiver module 402, determine target motor data based on the motor vibration type, and transmit, by using the transceiver module 402, the target motor data to the DSP by using the shared memory;

invoke the DSP to receive, by using the transceiver module 402, a target DAC channel that is for transmitting motor data and that is sent by the audio abstraction module, and control, by using the DSP, the DMA to transmit the target motor data to the target DAC channel in the codec chip by using the transceiver module 402; and invoke the target DAC channel in the codec chip to receive the target motor data by using the transceiver module 402, and transmit the target motor data to the ClassD by using the transceiver module 402 through the configured target DAC channel, to drive the motor.

In a possible implementation, when the display of the electronic device is in the screen-off state, and after the processing module 401 sends the motor vibration message to the motor abstraction module and the audio service module by using the transceiver module 402, the processing module 401 is further configured to:

invoke the audio service module to receive the motor vibration message by using the transceiver module 402, and send, by using the transceiver module 402, a motor startup message to the audio abstraction module based on the motor vibration message; and invoke the audio abstraction module to receive and deliver the motor startup message by using the transceiver module 402, to enable the motor vibration channel.

In a possible implementation, after invoking the audio service module to receive the motor vibration message by using the transceiver module 402, and send, by using the transceiver module 402, a motor startup message to the audio abstraction module based on the motor vibration message, the processing module 401 is further configured to invoke the audio service module to receive the motor vibration message by using the transceiver module 402 within a first preset time period.

In a possible implementation, after invoking the audio abstraction module to receive and deliver the motor startup message by using the transceiver module 402, to enable the motor vibration channel, the processing module 401 is further configured to: if the audio service module does not receive the motor vibration message within a second preset time period, invoke the audio service module to send a motor shutdown message to the audio abstraction module by using the transceiver module 402; and invoke the audio abstraction module to receive and deliver the motor shutdown message by using the transceiver module 402, to disable the motor vibration channel.

In a possible implementation, in terms of invoking the codec driver to receive the DAC channel configuration policy by using the transceiver module 402, and controlling, by using the codec driver, the codec chip to reconfigure the DAC channel based on the DAC channel configuration policy, the processing module 401 is configured to: invoke the codec driver to receive the DAC channel configuration policy by using the transceiver module 402, and determine whether there is an audio output service; and when an audio output service is detected, invoke the codec driver to disable an audio channel, and control the codec chip to reconfigure the DAC channel based on the DAC channel configuration policy.

In a possible implementation, when the headset insertion/removal message is the headset insertion message, and after reconfiguring the DAC channel based on the DAC channel configuration policy, the processing module 401 is further configured to: invoke the codec driver to enable an earpiece channel for transmitting earpiece data; and invoke the motor driver to enable a ClassD channel for transmitting motor data after a third preset time period.

It may be understood that, in this implementation, the channel configuration apparatus of driving a motor by using audio shown in FIG. 6 is applied to the electronic device in the channel configuration method of driving a motor by using audio in embodiments of this application, and may implement a corresponding procedure of the channel configuration method of driving a motor by using audio in embodiments of this application. For brevity, Details are not described herein again.

Figure 7:
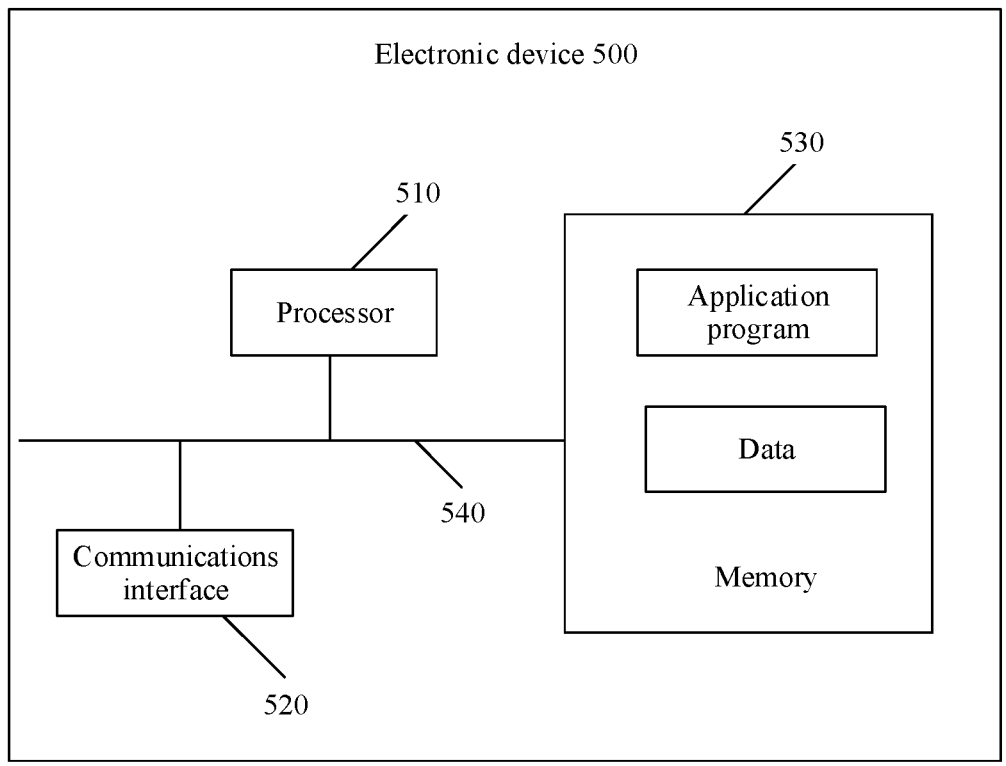
FIG. 7 is a schematic diagram of an electronic device according to an embodiment of this application.

FIG. 7 shows a schematic diagram of an electronic device 500 according to an embodiment of this application. As shown in FIG. 7, the electronic device 500 includes a processor 510, a communications interface 520, and a memory 530. The processor 510, the communications interface 520, and the memory 530 are connected to each other by using an internal bus 540.

The processor 510 may include one or more general-purpose processors, such as a central processing unit (central processing unit, CPU) or a combination of a CPU and a hardware chip. The hardware chip may be an application-specific integrated circuit (application specific integrated circuit, ASIC), a programmable logic device (programmable logic device, PLD), or a combination thereof. The PLD may be a complex programmable logic device (complex programmable logic device, CPLD), a field-programmable logic gate array (field-programmable gate array, FPGA), generic array logic (generic array logic, GAL), or any combination thereof.

The bus 540 may be a peripheral component interconnect (peripheral component interconnect, PCI) bus, an extended industry standard architecture (extended industry standard architecture, EISA) bus, or the like. The communications bus 540 may be classified into an address bus, a data bus, a control bus, or the like. For ease of expression, the bus is indicated by only a line in FIG. 6, but this does not mean that only one bus or one type of bus exists.

The memory 530 may include a volatile memory (volatile memory) such as a random access memory (random access memory, RAM); or the memory 530 may include a non-volatile memory (non-volatile memory) such as a read-only memory (read-only memory, ROM), a flash memory (flash memory), a hard disk drive (hard disk drive, HDD), or a solid-state drive (solid-state drive, SSD); or the memory 530 may include a combination of the foregoing types. The memory 530 may be configured to store a program and data, so that the processor 510 invokes the program code and the data stored in the memory 530, to implement functions of the foregoing processing module 401.

It may be understood that the electronic device shown in FIG. 7 may correspond to the electronic device in the channel configuration method of driving a motor by using audio in embodiments of this application, and may implement a corresponding procedure of the channel configuration method of driving a motor by using audio in embodiments of this application. For brevity, details are not described herein again.

An embodiment of this application further provides a readable storage medium. The readable storage medium stores an instruction, and when the instruction is run on an electronic device, the electronic device performs a related procedure in the foregoing method embodiment.

An embodiment of this application further provides a computer program product. When the computer program product runs on a terminal device, the terminal device implements the steps in the foregoing method embodiments when executing the computer program product.

In the foregoing embodiments, descriptions of all embodiments have respective focuses. For a part that is not described in detail or recorded in an embodiment, refer to related descriptions in other embodiments.

It should further be understood that "first", "second", "third", "fourth", and various numbers in this specification are merely used for differentiation for ease of description, and are not construed as any limitation on the scope of this application.

It should be further understood that sequence numbers of the processes do not mean execution sequences in various embodiments of this application. The execution sequences of the processes should be determined according to functions and internal logic of the processes, and should not be construed as any limitation on the implementation processes of embodiments of this application.

A person of ordinary skill in the art may be aware that, in combination with examples described in embodiments disclosed in this specification, units and algorithm steps may be implemented by electronic hardware or a combination of computer software and electronic hardware. Whether the functions are implemented by hardware or software depends on a particular application 510 and a design constraint condition of the technical solutions. A person skilled in the art may use different methods to implement the described functions for each particular application, but it should not be considered that the implementation goes beyond the scope of this application.

In the several embodiments according to this application, it should be understood that the disclosed device and method may be implemented in another manner. For example, the foregoing described device embodiments are merely examples. For example, division into modules is merely logical function division and there may be other division during actual implementation.

The foregoing embodiments are merely intended for describing the technical solutions of this application, rather than limiting this application. Although this application is described in detail with reference to the foregoing embodiments, a person of ordinary skill in the art should understand that they may still make modifications to the technical solutions described in the foregoing embodiments or make equivalent replacements to some technical features thereof, without departing from the scope of the technical solutions of the embodiments of this application.

What is claimed is:

1. A channel configuration method of driving a motor by using audio, applied to an electronic device, wherein the electronic device is provided with an Android system, a system of driving a motor by using audio that is of the electronic device comprises an audio service module, an audio abstraction module, a codec driver, and a codec chip, the audio service module is communicatively connected to the audio abstraction module, the audio abstraction module is communicatively connected to the codec driver, the codec driver is communicatively connected to the codec chip, the audio service module is disposed at an application architecture layer of the Android system, the audio abstraction module is disposed at a hardware abstraction layer of the Android system, the codec driver is disposed at a kernel layer of the Android system, the codec chip is disposed at a hardware layer of the Android system, and the method comprises:

receiving a headset insertion/removal message by using the audio service module, and sending the headset insertion/removal message to the audio abstraction module;

receiving the headset insertion/removal message by using the audio abstraction module, determining a digital-to-analog converter (DAC) channel configuration policy in the codec chip based on the headset insertion/removal message, and sending the DAC channel configuration policy to the codec driver, wherein a DAC channel is used to transmit earpiece or headset data, and transmit motor data to a class-D amplifier (ClassD) to drive the motor; and receiving the DAC channel configuration policy by using the codec driver, and controlling, by using the codec driver, the codec chip to reconfigure the DAC channel based on the DAC channel configuration policy.

2. The method according to claim 1, wherein the determining a digital-to-analog converter (DAC) channel configuration policy in the codec chip based on the headset insertion/removal message comprises:

when the headset insertion/removal message is a headset removal message, determining that the DAC channel configuration policy in the codec chip is a first DAC channel configuration policy; or when the headset insertion/removal message is a headset insertion message, determining that the DAC channel configuration policy in the codec chip is a second DAC channel configuration policy.

3. The method according to claim 2, wherein the first DAC channel configuration policy comprises: transmitting earpiece data through a DAC left (DAC L) channel, transmitting motor data through a DAC right (DAC R) channel, and transmitting ultrasonic data through a DAC ultrasonic (DAC UL) channel; or transmitting motor data through a DAC L channel, transmitting earpiece data through a DAC R channel, and transmitting ultrasonic data through a DAC UL channel.

4. The method according to claim 2, wherein the first DAC channel configuration policy comprises: transmitting earpiece data through a DAC left (DAC L) channel and/or a DAC right (DAC R) channel, and transmitting motor data through a DAC ultrasonic (DAC UL) channel.

5. The method according to claim 2, wherein the second DAC channel configuration policy comprises: transmitting first headset data through a DAC left (DAC L) channel, transmitting second headset data through a DAC right (DAC R) channel, and transmitting motor data through a DAC ultrasonic (DAC UL) channel.

6. The method according to claim 4, wherein the DAC UL channel further transmits ultrasonic data, and a priority of the motor data is different from a priority of the ultrasonic data.

7. The method according to claim 1, wherein when a display of the electronic device is in a screen-on state, a motor vibration channel for transmitting motor data is in a connected state; and when the display of the electronic device is in a screen-off state, the motor vibration channel is in a disconnected state, and the motor vibration channel comprises a DAC channel for transmitting motor data.

8. An electronic device, wherein the electronic device is provided with an Android system, a system of driving a motor by using audio that is of the electronic device comprises an audio service module, an audio abstraction module, a codec driver, and a codec chip, the audio service module is communicatively connected to the audio abstraction module, the audio abstraction module is communicatively connected to the codec driver, the codec driver is communicatively connected to the codec chip, the audio service module is disposed at an application architecture layer of the Android system, the audio abstraction module is disposed at a hardware abstraction layer of the Android system, the codec driver is disposed at a kernel layer of the Android system, the codec chip is disposed at a hardware layer of the Android system; wherein the electronic device comprises a memory and a processor, and the processor executes computer instructions stored in the memory, to enable the electronic device to perform:
- receiving a headset insertion/removal message by using the audio service module, and sending the headset insertion/removal message to the audio abstraction module;
- receiving the headset insertion/removal message by using the audio abstraction module, determining a digital-to-analog converter (DAC) channel configuration policy in the codec chip based on the headset insertion/removal message, and sending the DAC channel configuration policy to the codec driver, wherein a DAC channel is used to transmit earpiece or headset data, and transmit motor data to a class-D amplifier (ClassD) to drive the motor; and
- receiving the DAC channel configuration policy by using the codec driver, and controlling, by using the codec driver, the codec chip to reconfigure the DAC channel based on the DAC channel configuration policy.

9. The electronic device according to claim 8, wherein the determining a digital-to-analog converter (DAC) channel configuration policy in the codec chip based on the headset insertion/removal message comprises:
- when the headset insertion/removal message is a headset removal message, determining that the DAC channel configuration policy in the codec chip is a first DAC channel configuration policy; or
- when the headset insertion/removal message is a headset insertion message, determining that the DAC channel configuration policy in the codec chip is a second DAC channel configuration policy.

10. The electronic device according to claim 9, wherein the first DAC channel configuration policy comprises: transmitting earpiece data through a DAC left (DAC L) channel, transmitting motor data through a DAC right (DAC R) channel, and transmitting ultrasonic data through a DAC ultrasonic (DAC UL) channel; or transmitting motor data through a DAC L channel, transmitting earpiece data through a DAC R channel, and transmitting ultrasonic data through a DAC UL channel.

11. The electronic device according to claim 9, wherein the first DAC channel configuration policy comprises: transmitting earpiece data through a DAC left (DAC L) channel and/or a DAC right (DAC R) channel, and transmitting motor data through a DAC ultrasonic (DAC UL) channel.

12. The electronic device according to claim 9, wherein the second DAC channel configuration policy comprises: transmitting first headset data through a DAC left (DAC L) channel, transmitting second headset data through a DAC right (DAC R) channel, and transmitting motor data through a DAC ultrasonic (DAC UL) channel.

13. The electronic device according to claim 11, wherein the DAC UL channel further transmits ultrasonic data, and a priority of the motor data is different from a priority of the ultrasonic data.

14. The electronic device according to claim 8, wherein when a display of the electronic device is in a screen-on state, a motor vibration channel for transmitting motor data is in a connected state; and when the display of the electronic device is in a screen-off state, the motor vibration channel is in a disconnected state, and the motor vibration channel comprises a DAC channel for transmitting motor data.

15. The electronic device according to claim 8, wherein the system of driving a motor by using audio further comprises a first application program, a motor service module, a motor abstraction module, a motor driver, a motor, and a digital signal processing (DSP) module, the DSP comprises a shared memory and direct memory access (DMA), the first application program is communicatively connected to the motor service module, the motor service module is communicatively connected to the motor abstraction module and the audio service module, and the motor abstraction module is communicatively connected to the motor driver, the motor driver and the audio abstraction module are communicatively connected to the DSP, the shared memory is communicatively connected to the DMA, the DSP is communicatively connected to the codec chip, the codec chip is communicatively connected to the motor, the first application program is disposed at an application layer of the Android system, the motor service module is disposed at an application architecture layer of the Android system, the motor abstraction module is disposed at a hardware abstraction layer of the Android system, the motor driver and the DSP are disposed at a kernel layer of the Android system, the motor is disposed at a hardware layer of the Android system, and the electronic device is further enabled to perform:
- receiving a motor vibration instruction from the first application program by using the motor service module, converting the motor vibration instruction into a motor vibration message, and sending the motor vibration message to the motor abstraction module and the audio service module;
- parsing the motor vibration message by using the motor abstraction module, determining a motor vibration type corresponding to the motor vibration message, and sending the motor vibration type to the motor driver;
- receiving the motor vibration type by using the motor driver, determining target motor data based on the motor vibration type, and transmitting the target motor data to the DSP by using the shared memory;
- receiving, by using the DSP, a target DAC channel that is for transmitting motor data and that is sent by the audio abstraction module, and controlling, by using the DSP, the DMA to transmit the target motor data to the target DAC channel in the codec chip; and receiving the target motor data through the target DAC channel in the codec chip, and transmitting the target motor data to the ClassD through the configured target DAC channel to drive the motor.

16. The electronic device according to claim 14, wherein when the display of the electronic device is in the screen-off state, and after the sending the motor vibration message to the motor abstraction module and the audio service module, the electronic device is further enabled to perform:

receiving the motor vibration message by using the audio service module, and sending a motor startup message to the audio abstraction module based on the motor vibration message; and receiving and delivering the motor startup message by using the audio abstraction module, to enable the motor vibration channel.

17. The electronic device according to claim 16, wherein after the receiving the motor vibration message by using the audio service module, and sending a motor startup message to the audio abstraction module based on the motor vibration message, the electronic device is further enabled to perform:

receiving the motor vibration message by using the audio service module within a first preset time period.

18. The electronic device according to claim 16, wherein after the receiving and delivering the motor startup message by using the audio abstraction module, to enable the motor vibration channel, the electronic device is further enabled to perform:

if the audio service module does not receive the motor vibration message within a second preset time period, sending a motor shutdown message to the audio abstraction module; and receiving and delivering the motor shutdown message by using the audio abstraction module, to disable the motor vibration channel.

19. The electronic device according to claim 8, wherein the receiving the DAC channel configuration policy by using the codec driver, and controlling, by using the codec driver, the codec chip to reconfigure the DAC channel based on the DAC channel configuration policy comprises:

receiving, by using the codec driver, the DAC channel configuration policy, and determining whether there is an audio output service; and when an audio output service is detected, disabling an audio channel by using the codec driver, and controlling the codec chip to reconfigure the DAC channel based on the DAC channel configuration policy.

20. The electronic device according to claim 8, wherein when the headset insertion/removal message is the headset insertion message, and after the reconfiguring the DAC channel based on the DAC channel configuration policy, the electronic device is further enabled to perform:

enabling, by using the codec driver, an earpiece channel for transmitting earpiece data; and enabling a ClassD channel for transmitting motor data by using the motor driver after a third preset time period.

* * * * *